(12) United States Patent
Velmurugan et al.

(10) Patent No.: US 10,648,097 B2
(45) Date of Patent: May 12, 2020

(54) COPPER ELECTRODEPOSITION ON COBALT LINED FEATURES

(71) Applicant: Lam Research Corporation, Fremont, CA (US)

(72) Inventors: Jeyavel Velmurugan, Gaithersburg, MD (US); Bryan L. Buckalew, Tualatin, OR (US); Thomas A. Ponnuswamy, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/941,258

(22) Filed: Mar. 30, 2018

(65) Prior Publication Data

US 2019/0301040 A1 Oct. 3, 2019

(51) Int. Cl.
| | |
|---|---|
| *C25D 3/38* | (2006.01) |
| *C25D 7/12* | (2006.01) |
| *C25D 3/56* | (2006.01) |
| *C25D 17/00* | (2006.01) |
| *C25D 5/34* | (2006.01) |
| *H01L 21/288* | (2006.01) |
| *H01L 21/768* | (2006.01) |

(Continued)

(52) U.S. Cl.
CPC .............. *C25D 3/38* (2013.01); *C25D 3/562* (2013.01); *C25D 5/34* (2013.01); *C25D 7/123* (2013.01); *C25D 17/001* (2013.01); *H01L 21/2885* (2013.01); *H01L 21/76861* (2013.01); *H01L 21/76873* (2013.01); *H01L 21/76879* (2013.01); *H01L 21/76898* (2013.01); *H01L 23/481* (2013.01); *H01L 23/53238* (2013.01)

(58) Field of Classification Search
None
See application file for complete search history.

(56) References Cited

U.S. PATENT DOCUMENTS

| | | |
|---|---|---|
| 6,440,289 B1 | 8/2002 | Woo et al. |
| 7,329,334 B2 | 2/2008 | Herdman et al. |
| | (Continued) | |

FOREIGN PATENT DOCUMENTS

| | | |
|---|---|---|
| WO | 2019191523 | 10/2019 |

OTHER PUBLICATIONS

International Application Serial No. PCT/US2019/024722, International Search Report dated Aug. 2, 2019, 4 pgs.

(Continued)

*Primary Examiner* — Moazzam Hossain
*Assistant Examiner* — Stanetta D Isaac
(74) *Attorney, Agent, or Firm* — Schwegman Lundberg & Woessner, P.A.

(57) ABSTRACT

In one example, an electroplating system comprises a bath reservoir, a holding device, an anode, a direct current power supply, and a controller. The bath reservoir contains an electrolyte solution. The holding device holds a wafer submerged in the electrolyte solution. The wafer comprises features covered by a cobalt layer. The anode is opposite to the wafer and submerged in the electrolyte solution. The direct current power supply generates a direct current between the holding device and the anode. A combination of forward and reverse pulses is applied between the holding device and the anode to electroplate a copper layer on the cobalt layer of the wafer.

10 Claims, 8 Drawing Sheets

(51) Int. Cl.
*H01L 23/48* (2006.01)
*H01L 23/532* (2006.01)

(56) References Cited

U.S. PATENT DOCUMENTS

| | | | |
|---|---|---|---|
| 7,964,506 B1* | 6/2011 | Ponnuswamy | C25D 3/38 |
| | | | 257/E21.311 |
| 2007/0125657 A1 | 6/2007 | Sun et al. | |
| 2009/0250352 A1* | 10/2009 | Dubin | C25D 3/38 |
| | | | 205/143 |
| 2014/0224661 A1* | 8/2014 | Spurlin | C25D 7/123 |
| | | | 205/83 |
| 2015/0299886 A1* | 10/2015 | Doubina | C25D 5/34 |
| | | | 205/157 |
| 2016/0258077 A1 | 9/2016 | Macioßek et al. | |

OTHER PUBLICATIONS

International Application Serial No. PCT/US2019/024722, Written Opinion dated Aug. 2, 2019, 7 pgs.

* cited by examiner

COPPER ELECTRODEPOSITION ON COBALT LINED FEATURES

FIELD

The present disclosure relates generally to electroplating systems and methods, and in particular to systems and methods for directly electroplating copper on a cobalt liner.

BACKGROUND

In conventional electroplating methods, copper electrodeposition in the presence of additives can produce void-free plating of submicron features such as vias and trenches in dual-damascene metallization. This approach is conventionally practiced for fabricating interconnects in advanced microprocessors at sub-50 nm technology nodes. However, as interconnects shrink in dimension, scaling the interconnect metallization process to narrower geometries becomes increasingly difficult. For example, physical vapor deposition (PVD) of copper on the cobalt liner can result in undesirable defects such as protrusion, or "overhang," at the feature opening leading to pinch-off. Furthermore, sidewall step coverage of these small features can also result in sidewall voiding after plating. Such defects can lead to electrical shorts and reliability problems.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

DESCRIPTION OF THE DRAWINGS

Some embodiments are illustrated by way of example and not limitation in the views of the accompanying drawings.

DESCRIPTION

Figure 1:
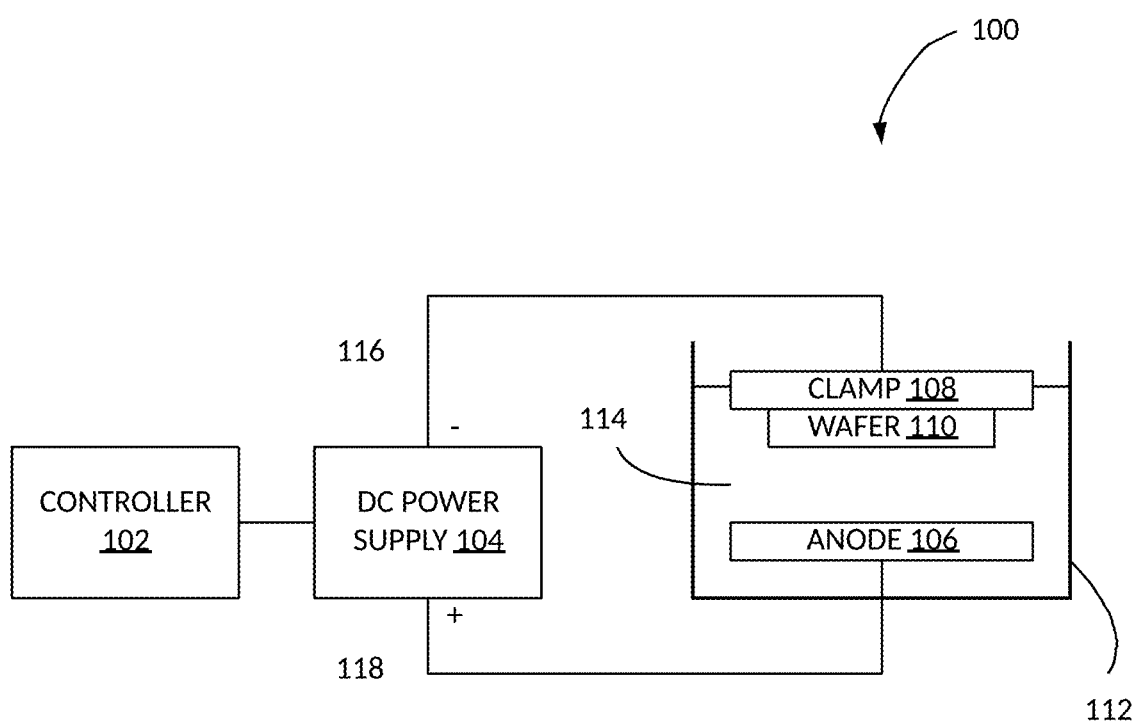
FIG. 1 is a block diagram of an electroplating system, according to an example embodiment.

The description that follows includes systems, methods, techniques, instruction sequences, and computing machine program products that embody illustrative embodiments of the present inventive subject matter. In the following description, for purposes of explanation, numerous specific details are set forth in order to provide a thorough understanding of example embodiments. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright LAM Research Corporation, 2018, All Rights Reserved.

In the present disclosure, various terms are used to describe a semiconductor processing surface: "wafer" and "substrate" may be used interchangeably. The process of depositing, or plating, metal onto a conductive surface of the wafer via an electrochemical reaction may be referred to generally as "electrodeposition" or "electroplating."

A wafer includes features such as trenches and vias that form interconnects. As the interconnects shrink in dimension (e.g., sub-50 nm scale), metallization of the features in narrower geometries becomes increasingly more difficult. For example, defects such as "overhangs" surrounding the vias can cause the copper plating to pinch off and leave void defects in the features.

To address the above challenges, the present disclosure describes an alternative electroplating process based on direct copper electrodeposition onto conformal diffusion-barriers such as cobalt. This electroplating process uses electrodeposition chemistries that enable copper nucleation and uniform deposition on the wafer (e.g., a 300 mm resistive wafer). A bath of alkaline complexed-copper electrolytes provides for better copper nucleation density and plating uniformity than acid electrolytes. Alkaline complexed-copper electrolytes have lower susceptibility to seed layer dissolution in comparison to acid electrolytes. Therefore, one benefit of direct plating on cobalt from an alkaline complexed-copper bath is that sidewall voiding is minimized or eliminated. The present disclosure describes an electroplating process in a bath of alkaline complexed-copper electrolytes that prevents or minimizes the formation of seam or center voids in the features of the wafer.

In some example embodiments of the present disclosure, an electroplating process that uses a bath of alkaline complexed-copper electrolytes with a combination of forward and reverse direct current pulses is provided. This electroplating process enables direct deposition of a copper layer on a cobalt liner on the features of a wafer without resulting in seams or voids in the vias and trenches of the wafer.

FIG. 1 is a block diagram of an electroplating system 100, according to an example embodiment. The electroplating system 100 comprises a bath reservoir 112, a holding device such as a clamp 108, an anode 106, a direct current (DC) power supply 104, and a controller 102.

The bath reservoir 112 contains an alkaline complexed-copper electrolyte solution 114. In one example, the alkaline complexed-copper electrolyte solution 114 includes copper (e.g., from about 0.5 g/L to about 2.0 g/L), complexing ligands (e.g., ethylenediaminetetraacetic acid or EDTA) and additives (e.g., accelerator and suppressor). The alkaline complexed-copper electrolyte solution 114 is continuously provided to the bath reservoir 112 with a pump (not shown). The alkaline complexed-copper electrolyte solution 114 is circulated into and out of the bath reservoir 112 by the pump.

The clamp 108 holds a wafer 110 submerged in the alkaline complexed-copper electrolyte solution 114. In one example, the clamp 108 includes a holding apparatus mounted to a spindle that allows rotation of the clamp 108 and the wafer 110.

The wafer 110 comprises features (vias and trenches) deposited with a cobalt layer using, for example, an atomic layer deposition (ALD) process or a chemical vapor deposition (CVD) process.

The DC power supply 104 generates a direct current flow between the clamp 108 and the anode 106. The DC power supply 104 includes a negative output electrode 116 and a positive output electrode 118. The negative output electrode 116 is electrically connected to the clamp 108 and the wafer 110. The positive output electrode 118 is electrically connected to the anode 106 located in the alkaline complexed-copper electrolyte solution 114. The anode 106 is located opposite to the wafer 110 in the alkaline complexed-copper electrolyte solution 114.

The controller 102 is connected to the DC power supply 104 and is programmed to control the DC power supply 104. For example, the controller 102 includes program instructions specifying current and voltage levels that are to be applied to the wafer 110 along with durations and times at which the current and voltage levels change. In one example embodiment, the controller 102 controls the DC power supply 104 to generate a combination of forward and reverse pulses between the clamp 108/the wafer 110 and the anode 106. The forward pulse includes a direct current for a predefined duration (e.g., 100 ms) that causes copper from the alkaline complexed-copper electrolyte solution 114 to be deposited on the wafer 110. The reverse pulse includes a direct current of reverse polarity for a predefined duration (e.g., 10 ms) that causes copper from the wafer 110 to be removed.

During a forward pulse, the DC power supply 104 biases the wafer 110 to have a negative potential relative to the anode 106. This causes an electrical current to flow from the anode 106 to the wafer 110, and an electrochemical reduction (e.g., $Cu^{2+}+2e^-\rightarrow Cu^0$) occurs on the wafer surface (the cathode), which results in the deposition of copper on the surface of the wafer 110. During a reverse pulse, the opposite takes place: the reaction on the wafer surface is an oxidation (e. g., $Cu^0 \rightarrow Cu^{2+}+2e^-$) that results in the removal of copper from the surface of the wafer 110.

Figure 2:
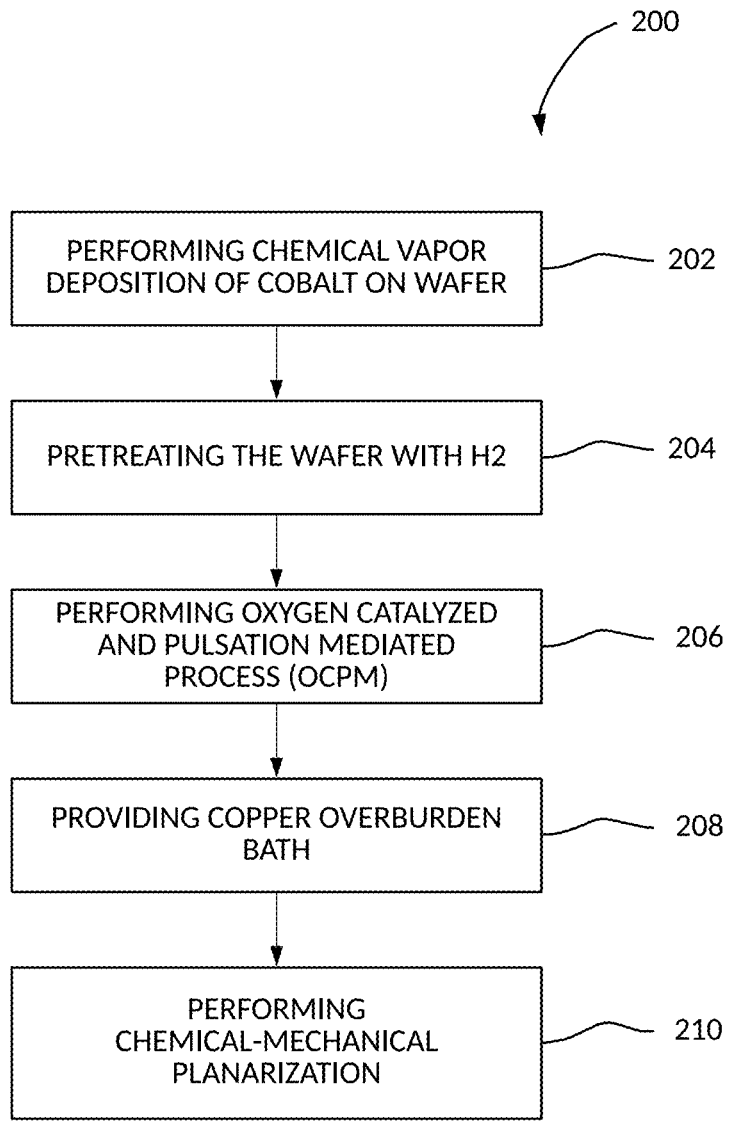
FIG. 2 is a flow chart for a method for processing a wafer, according to an example embodiment.

FIG. 2 is a flow chart for a method 200 for processing a wafer, according to an example embodiment. The method 200 comprises, at operation 202, performing CVD of cobalt on the wafer 110. An ALD process deposits a very thin layer of cobalt using alternating doses of precursor material that first saturates the surface and then forms the thin cobalt layer deposit. A CVD process involves providing one or more gaseous reactants to a chamber that react to deposit a cobalt film on the surface of the wafer. Although ALD and CVD processes are commonly used to deposit a cobalt (or other semi-noble metal) layer, other deposition processes may be used. At operation 204, the wafer 110 is pretreated with hydrogen-helium plasma at high temperature. CVD-deposited Cobalt starts forming native oxide when exposed to atmosphere, resulting in a thickness of about 1 nm to about 1.2 nm. Plating Copper on Cobalt oxide can be challenging because the plating can result in sidewall voiding or poor adhesion. High temperature (such as about 250° C.) pretreat can help to remove all oxides with agglomerating Cobalt. At operation 206, an oxygen catalyzed and pulsation mediated process (OCPM) is performed. The first step in OCPM process is initiation and setup of a Cu-complex passivation layer. High mass transfer condition helps to achieve uniform field and feature passivation. When Copper electroplating potential is applied, $O_2$ reduction reaction consumes available $O_2$ in the feature. Water reduction reaction then proceeds and increases pH. Elevated pH disrupts the passivation film and Cu deposition is favored. Short reverse pulses are then applied for Cu+ generation and improve passivation integrity on the field which promotes super-conformal fill. Reverse pulse helps to achieve some etch/strip which helps to facilitate smooth intra-feature nucleation characteristics.

At operation 208, a conventional bath of Copper (e.g., from about 2 g/L to about 40 g/L), acid (e.g., from about 10 g/L to about 20 g/L) and Chloride (e.g., from about 30 ppm to about 100 ppm) is used to deposit Copper overburden. At operation 210, a chemical-mechanical planarization (CMP) is performed to planarize the wafer 110 and to remove excess copper.

The present disclosure also includes example methods. In one example, with reference to FIG. 3, an electroplating method 300 comprises, at operation 302, submerging a wafer in a bath reservoir containing an electrolyte solution. At operation 304, a combination of forward and reverse pulses is generated. The combination of forward and reverse pulses includes a combination of a high convection forward pulse, a high convection reverse pulse, and a low convection reverse pulse. At operation 306, a copper layer is deposited on a cobalt layer of the wafer by applying the combination of forward and reverse pulses to the wafer and an anode disposed opposite to the wafer in the electrolyte solution.

In some examples, the combination of forward and reverse pulses includes the high convection forward pulse, followed by the high convection reverse pulse, and followed by the low convection reverse pulse. The high convection forward pulse and the high convection reverse pulse each include a convection of at least about 150 rpm. The high convection forward pulse comprises a forward direct current with an intensity of at least about 0.85 mA/cm² for at least about 100 ms, and no direct current for at least about 200 ms following the forward direct current. The high convection reverse pulse comprises a forward direct current with an intensity of at least about 0.85 mA/cm² for at least about 100 ms, a reverse direct current with an intensity of at least about −0.85 mA/cm² for at least about 10 ms following the forward direct current, and no direct current for at least about 200 ms following the reverse direct current. The low convection reverse pulse includes a convection of at most about 20 rpm, wherein the low convection reverse pulse comprises a forward direct current with an intensity of at least about 0.85 mA/cm² for at least about 100 ms, a reverse direct current with an intensity of at least about −0.85 mA/cm² for at least about 10 ms following the forward direct current, and no direct current for at least about 200 ms following the reverse direct current. The electrolyte solution comprises an alkaline complexed-copper electrolyte solution.

Figure 4:
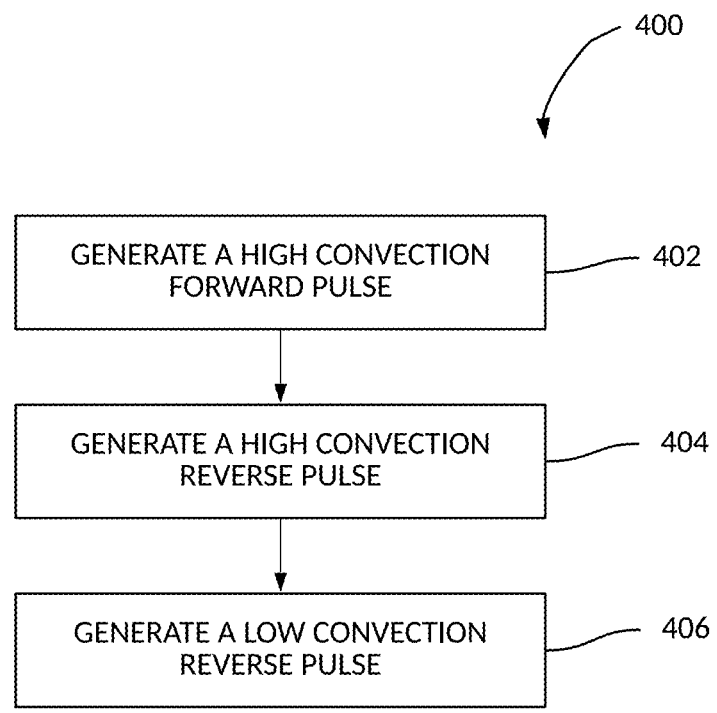
FIG. 4 is a flow chart for a method for electroplating, according to another example embodiment.

FIG. 4 is a flow chart for a method 400 for electroplating a wafer, according to another example embodiment. The method 400 comprises, at operation 402, generating a high-convection forward pulse with the DC power supply 104. In one example embodiment, the DC power supply 104 generates a current from about 0.60 mA/cm² to about 2.0 mA/cm² for about 100 ms to about 200 ms. The DC power supply 104 then turns off the current for about 200 ms to about 500 ms. The rotation rate of the wafer is about 100 rpm to about 200 rpm during the high-convection forward pulse.

At operation 404, the DC power supply 104 generates a high-convection reverse pulse. In one example embodiment, the DC power supply 104 generates a current of about 0.60 mA/cm$^2$ to about 2.0 mA/cm$^2$ for about 100 ms to about 200 ms. The DC power supply 104 then generates a reverse current from about −0.60 mA/cm$^2$ to about −2.0 mA/cm$^2$ for a duration of about 10 ms to about 20 ms. The DC power supply 104 then turns off the current for about 200 ms to about 500 ms. The rotation rate of the wafer is about 100 rpm to about 200 rpm during the high-convection reverse pulse.

At operation 406, the DC power supply 104 generates a low-convection reverse pulse. In one example embodiment, the DC power supply 104 generates a current of about 0.60 mA/cm$^2$ to about 2.0 mA/cm$^2$ for about 100 ms to about 200 ms. The DC power supply 104 then generates a reverse current of about −0.6 mA/cm$^2$ to about 2.0 mA/cm$^2$ for about 10 ms to about 20 ms. The DC power supply 104 then turns off the current for about 200 ms to about 500 ms. The rotation rate of the wafer is about 10 rpm to about 25 rpm during the low-convection reverse pulse.

Figure 5:
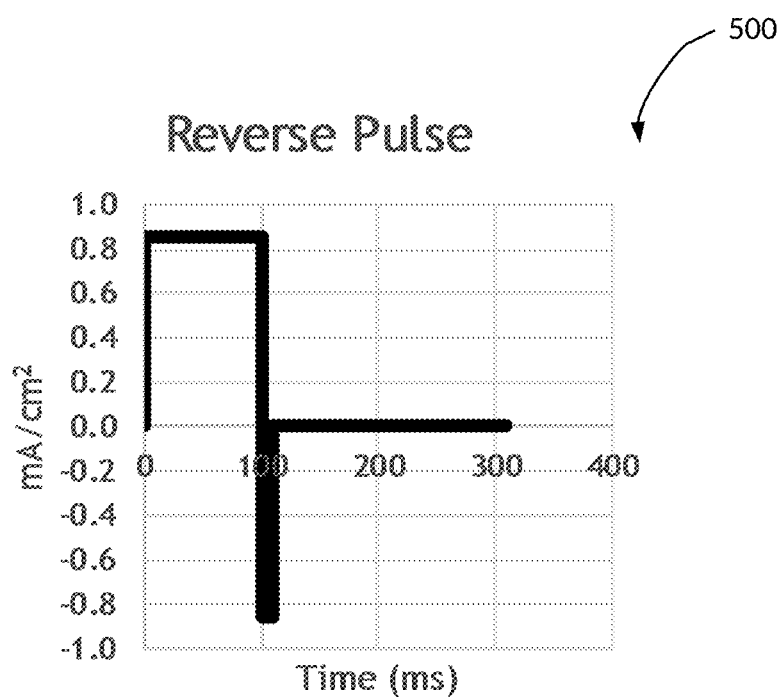
FIG. 5 is a graph depicting an example of a reverse pulse, according to another example embodiment.

FIG. 5 is a graph depicting an example of a reverse pulse 500, according to another example embodiment. The reverse pulse 500 includes a positive current of about 0.85 mA/cm$^2$ for about 100 ms, followed by a negative current of about −0.85 mA/cm$^2$ for about 10 ms, followed by no current for about 200 ms.

Figure 6:
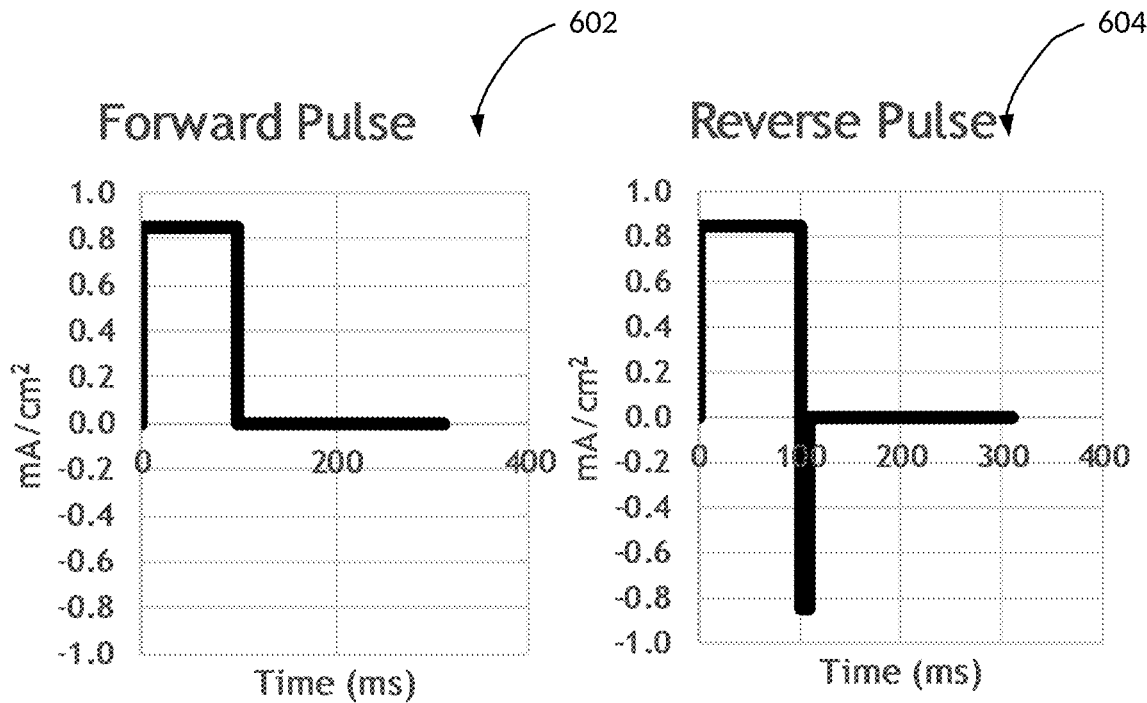
FIG. 6 illustrates two graphs depicting an example of a forward pulse and a reverse pulse, according to another example embodiment.

FIG. 6 illustrates two graphs depicting an example of a forward pulse 602 and a reverse pulse 604, according to another example embodiment. The forward pulse 602 includes a positive current of about 0.85 mA/cm$^2$ for about 100 ms followed by no current for about 200 ms. The reverse pulse 604 includes a positive current of about 0.85 mA/cm$^2$ for about 100 ms, followed by a negative current of about −0.85 mA/cm$^2$ for about 10 ms, followed by no current for about 200 ms.

Figure 3:
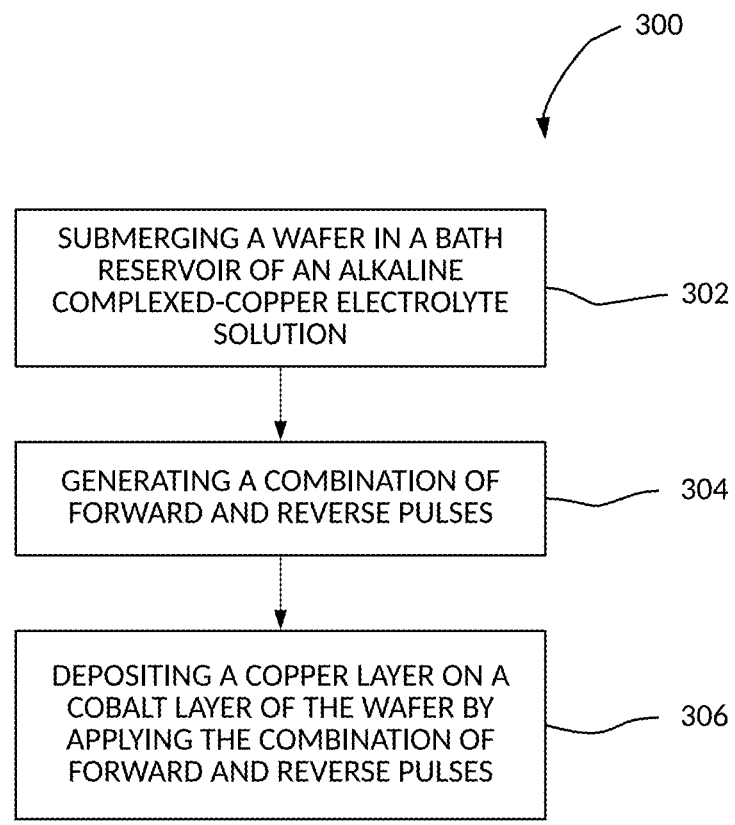
FIG. 3 is a flow chart for a method for electroplating, according to an example embodiment.
Figure 7A:
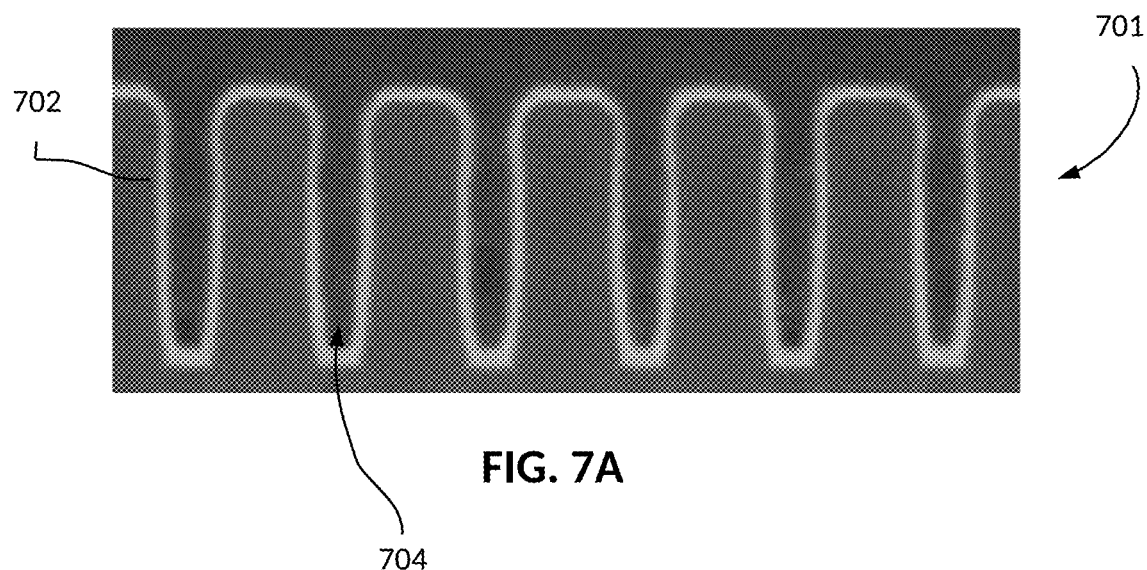
FIGS. 7A-7D are cross-sectional depictions of a wafer illustrating a copper layer deposit on the cobalt layer.
Figure 7B:
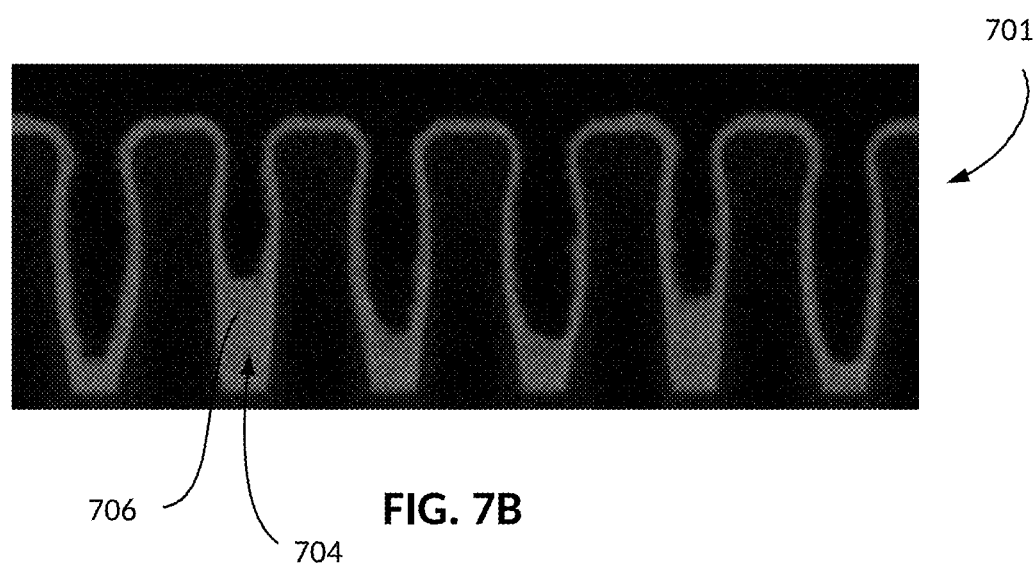
Figure 7C:
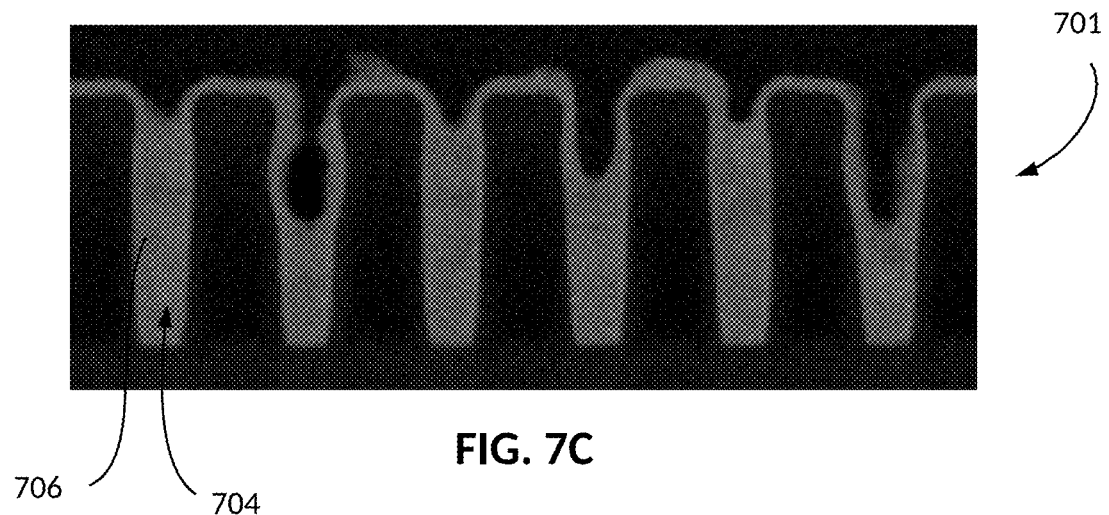
Figure 7D:
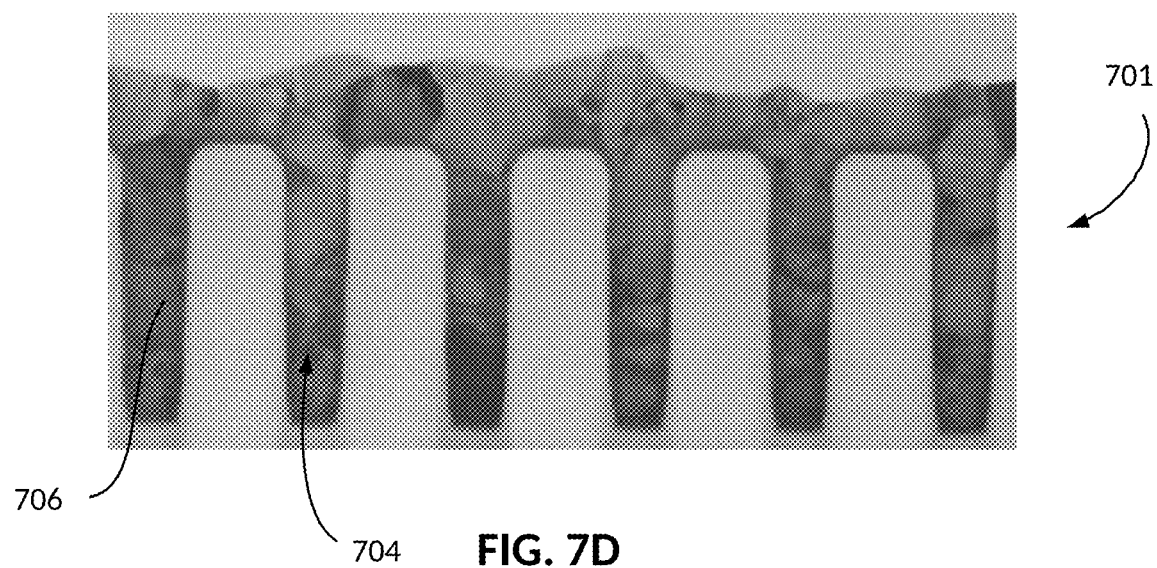

FIGS. 7A-7D are cross-sectional depictions of a wafer prior to, during, and after the electroplating process described in FIG. 3. FIG. 7A illustrates a cross-section of features of a wafer 701 prior to the electroplating process. A cobalt layer 702 is shown deposited on vias 704. FIG. 7B illustrates an example of a cross-section of features of the wafer 701 after a series of forward and reverse pulses. A copper layer 706 is shown as partially filling the bottoms of the vias 704. FIG. 7C illustrates another example of a cross-section of features of the wafer 701 after a series of forward and reverse pulses. The copper layer 706 is shown as partially filling the vias 704. FIG. 7D illustrates another example of a cross-section of features of the wafer 701 after a series of forward and reverse pulses. The vias 704 are filled with the copper layer 706 without any void in the vias 704.

Thus, in some examples, there is provided an electroplating system comprising: a bath reservoir for containing an electrolyte solution; a holding device for holding a wafer submerged in the electrolyte solution, the wafer comprising features covered by a cobalt layer; an anode disposed opposite to the wafer and submerged in the electrolyte solution; a direct current power supply for generating a direct current between the holding device and the anode; and a controller coupled to the direct current power supply, the controller configured to control the direct current power supply to generate a combination of forward and reverse pulses between the holding device and the anode, and to electroplate a copper layer on the cobalt layer of the wafer.

In some examples, the combination of forward and reverse pulses includes a high convection forward pulse, a high convection reverse pulse, and a low convection reverse pulse. The high convection forward pulse and the high convection reverse pulse each include a convection of at least 150 rpm. The high convection forward pulse comprises a forward direct current with an intensity of at least 0.85 mA/cm$^2$ for at least 100 ms, and no direct current for at least 200 ms following the forward direct current. The high convection reverse pulse comprises a forward direct current for at least 100 ms, a reverse direct current for at least 10 ms following the forward direct current, and no direct current for at least 200 ms following the reverse direct current. The low convection reverse pulse includes a convection of at most 20 rpm, wherein the low convection reverse pulse comprises a forward direct current with an intensity of at least 0.85 mA/cm$^2$ for at least 100 ms, a reverse direct current with an intensity of at least −0.85 mA/cm$^2$ for at least 10 ms following the forward direct current, and no direct current for at least 200 ms following the reverse direct current. The electrolyte solution comprises an alkaline complexed-copper electrolyte solution.

In some examples, a non-transitory machine-readable medium includes instructions that, when read by a machine, cause the machine to control operations in methods comprising at least the non-limiting example operations summarized above.

Figure 8:
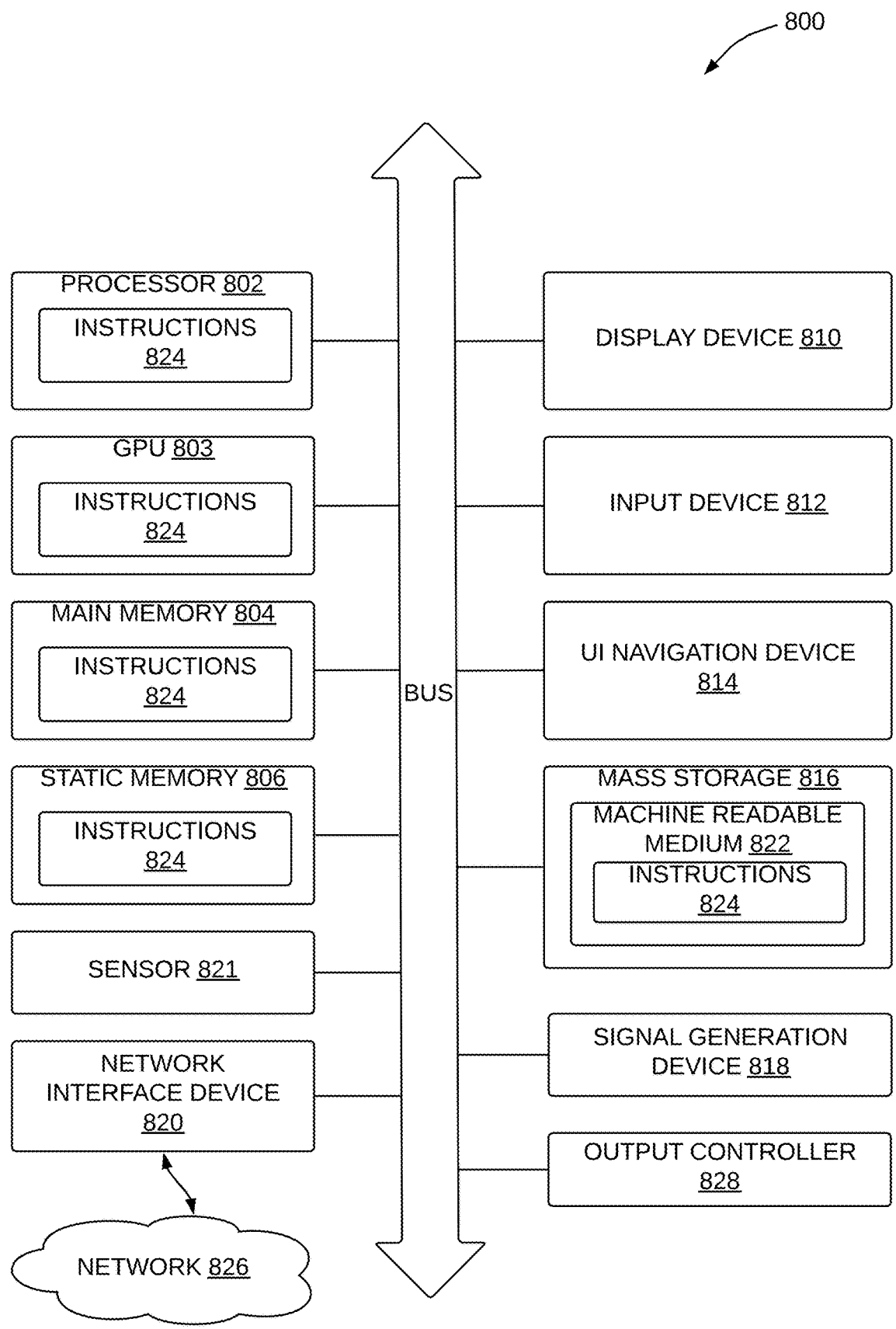
FIG. 8 is a block diagram illustrating an example of a machine upon which one or more example embodiments may be implemented, or by which one or more example embodiments may be controlled.

FIG. 8 is a block diagram illustrating an example of a machine 800 upon which one or more example process embodiments described herein may be implemented, or by which one or more example process embodiments described herein may be controlled. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in a peer-to-peer (P2P) (or other distributed) network environment. Further, while only a single machine 800 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, and a number of components or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 800 may include a hardware processor 802 (e.g., a central processing unit (CPU), a hardware processor core, or any combination thereof), a graphics processing unit (GPU) 803, a main memory 804, and a static memory 806, some or all of which may communicate with each other via an interlink (e.g., bus) 808. The machine 800 may further include a display device 810, an alphanumeric input device 812 (e.g., a keyboard), and a user interface (UI) navigation device 814 (e.g., a mouse). In an example, the display device 810, alphanumeric input device 812, and UI navigation device 814 may be a touch screen display. The machine 800 may additionally include a mass storage device (e.g., drive unit) 816, a signal generation device 818 (e.g., a speaker), a network interface device 820, and one or more sensors 821, such as a Global Positioning System (GPS) sensor, compass, accelerometer, or another sensor. The machine 800 may include an output controller 828, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 816 may include a machine-readable medium 822 on which is stored one or more sets of data structures or instructions 824 (e.g., software) embodying or utilized by any one or more of the techniques or functions described herein. The instructions 824 may also reside, completely or at least partially, within the main memory 804, within the static memory 806, within the hardware processor 802, or within the GPU 803 during execution thereof by the machine 800. In an example, one or any combination of the hardware processor 802, the GPU 803, the main memory 804, the static memory 806, or the mass storage device 816 may constitute machine-readable media 822.

While the machine-readable medium 822 is illustrated as a single medium, the term "machine-readable medium" may include a single medium or multiple media (e.g., a centralized or distributed database, and/or associated caches and servers) configured to store the one or more instructions 824.

The term "machine-readable medium" may include any medium that can store, encode, or carry instructions 824 for execution by the machine 800 and that cause the machine 800 to perform any one or more of the techniques of the present disclosure, or that can store, encode, or carry data structures used by or associated with such instructions 824. Non-limiting machine-readable medium examples may include solid-state memories, and optical and magnetic media. In an example, a massed machine-readable medium comprises a machine-readable medium 822 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 824 may further be transmitted or received over a communications network 826 using a transmission medium via the network interface device 820.

Although an embodiment has been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

What is claimed is:

1. A method for electroplating a wafer, the method comprising:
submerging the wafer in a bath reservoir containing an electrolyte solution;
generating a combination of forward and reverse pulses, the combination of forward and reverse pulses including a high convection forward pulse, followed by a high convection reverse pulse, and followed by a low convection reverse pulse, the high convection forward pulse and the high convection reverse pulse each including a convection of at least 150 rpm, the low convection reverse pulse including a convection of at most 20 rpm; and
depositing a copper layer on a cobalt layer of the wafer by applying the combination of forward and reverse pulses to the wafer and an anode disposed opposite to the wafer in the electrolyte solution.

2. The method of claim 1, wherein the high convection forward pulse comprises a forward direct current with an intensity of at least 0.85 $mA/cm^2$ for at least 100 ms, and no direct current for at least 200 ms following the forward direct current.

3. The method of claim 1, wherein the high convection reverse pulse comprises a forward direct current with an intensity of at least 0.85 $mA/cm^2$ for at least 100 ms, a reverse direct current with an intensity of at least −0.85 $mA/cm^2$ for at least 10 ms following the forward direct current, and no direct current for at least 200 ms following the reverse direct current.

4. The method of claim 1, wherein the low convection reverse pulse comprises a forward direct current with an intensity of at least 0.85 $mA/cm^2$ for at least 100 ms, a reverse direct current with an intensity of at least −0.85 mA/cm² for at least 10 ms following the forward direct current, and no direct current for at least 200 ms following the reverse direct current.

5. The method of claim 1, wherein the electrolyte solution comprises an alkaline complexed-copper electrolyte solution.

6. A method comprising:
providing a semiconductor wafer having a cobalt layer thereon; and
depositing a copper layer on the cobalt layer using an electroplating process by applying a combination of forward direct current pulse and reverse direct current pulse to the semiconductor wafer submerged in an electrolyte solution, wherein the combination of forward direct current pulse and reverse direct current pulse includes a series of a high convection forward pulse, followed by a high convection reverse pulse, and followed by a low convection reverse pulse, the high convection forward pulse and the high convection reverse pulse each including a convection of at least 150 rpm, the low convection reverse pulse includino a convection of at most 20 rpm, wherein the high convection forward pulse includes a convection of at least 150 rpm, wherein the low convection reverse pulse includes a convection of at most 20 rpm.

7. The method of claim 6, wherein the high convection forward pulse comprises a forward direct current with an intensity of at least 0.85 mA/cm² for at least 100 ms, and no direct current for at least 200 ms following the forward direct current.

8. The method of claim 6, wherein the high convection reverse pulse comprises a forward direct current with an intensity of at least 0.85 mA/cm² for at least 100 ms, a reverse direct current with an intensity of at least −0.85 mA/cm² for at least 10 ms following the forward direct current, and no direct current for at least 200 ms following the reverse direct current.

9. The method of claim 6, wherein the low convection reverse pulse comprises a forward direct current with an intensity of at least 0.85 mA/cm² for at least 100 ms, a reverse direct current with an intensity of at least −0.85 mA/cm² for at least 10 ms following the forward direct current, and no direct current for at least 200 ms following the reverse direct current.

10. A machine-readable medium including instructions which, when read by a machine, cause the machine to control operations in an electroplating method, the electroplating method comprising, at least:
submerging a wafer in a bath reservoir containing an electrolyte solution;
generating a combination of forward and reverse pulses, the combination of forward and reverse pulses including a high convection forward pulse, followed by a high convection reverse pulse, and followed by a low convection reverse pulse, the high convection forward pulse and the high convection reverse pulse each including a convection of at least 150 rpm, the low convection reverse pulse including a convection of at most 20 rpm; and
depositing a copper layer on a cobalt layer of the wafer by applying the combination of forward and reverse pulses to the wafer and an anode disposed opposite to the wafer in the electrolyte solution.

* * * * *